(12) United States Patent
King (10) Patent No.: US 7,012,842 B2
(45) Date of Patent: Mar. 14, 2006

(54) ENHANCED READ AND WRITE METHODS FOR NEGATIVE DIFFERENTIAL RESISTANCE (NDR) BASED MEMORY DEVICE

(75) Inventor: Tsu-Jae King, Fremont, CA (US)

(73) Assignee: Progressant Technologies, Inc., Mountain View, CA (US)

( * ) Notice: Subject to any disclaimer, the term of this patent is extended or adjusted under 35 U.S.C. 154(b) by 41 days.

(21) Appl. No.: 11/010,132

(22) Filed: Dec. 9, 2004

(65) Prior Publication Data

US 2005/0128797 A1   Jun. 16, 2005

Related U.S. Application Data

(63) Continuation of application No. 10/185,247, filed on Jun. 28, 2002, now Pat. No. 6,847,562.

(51) Int. Cl.
*G11C 16/06* (2006.01)

(52) U.S. Cl. .......................... 365/189.09; 365/189.07; 365/189.11

(58) Field of Classification Search ........... 365/189.09, 365/189.07, 189.03, 189.08, 189.11
See application file for complete search history.

(56) References Cited

U.S. PATENT DOCUMENTS

| | | | |
|---|---|---|---|
| 3,588,736 A | 6/1971 | McGroddy |
| 3,903,542 A | 9/1975 | Nathanson et al. |
| 3,974,486 A | 8/1976 | Curtis et al. |
| 4,047,974 A | 9/1977 | Harari |
| 4,143,393 A | 3/1979 | DiMaria et al. |
| 4,644,386 A | 2/1987 | Nishizawa et al. |
| 4,806,998 A | 2/1989 | Vinter et al. |
| 4,945,393 A | 7/1990 | Beltram et al. |
| 5,021,841 A | 6/1991 | Leburton et al. |
| 5,023,836 A | 6/1991 | Mori |
| 5,032,891 A | 7/1991 | Takagi et al. |
| 5,084,743 A | 1/1992 | Mishra et al. |
| 5,093,699 A | 3/1992 | Weichold et al. |
| 5,130,763 A | 7/1992 | Delhaye et al. |

(Continued)

FOREIGN PATENT DOCUMENTS

EP    0747940 A2   12/1996

(Continued)

OTHER PUBLICATIONS

Barlow, P. S. et al., "Negative differential output conductance of self-heated power MOSFETs," IEE Proceedings-I Solid State and Electron Devices, vol. 133, Part I, No. 5, Oct. 1986, pp. 177-179.

(Continued)

*Primary Examiner*—Anh Phung
*Assistant Examiner*—Hien Nguyen
(74) *Attorney, Agent, or Firm*—Bever, Hoffman & Harms, LLP; John M. Kubodera (57) ABSTRACT

An enhanced method of writing and reading a memory device, such as an SRAM using negative differential resistance (NDR) elements), is disclosed. This is done through selective control of biasing of the active elements in a memory cell. For example in a write operation, a memory cell is placed in an intermediate state to increase write speed. In an NDR based embodiments, this is done by reducing a bias voltage to NDR FETs so as to weaken the NDR element (and thus disable an NDR effect) during the write operation. Conversely, during a read operation, the bias voltages are increased to enhance peak current (as well as an NDR effect), and thus provide additional current drive to a BIT line. Embodiments using such procedures achieve superior peak to valley current ratios (PVR), read/write speed, etc.

8 Claims, 3 Drawing Sheets

U.S. PATENT DOCUMENTS

| | | | |
|---|---|---|---|
| 5,162,880 A | 11/1992 | Hazama et al. |
| 5,189,499 A | 2/1993 | Izumi et al. |
| 5,357,134 A | 10/1994 | Shimoji |
| 5,390,145 A | 2/1995 | Nakasha et al. |
| 5,442,194 A | 8/1995 | Moise |
| 5,448,513 A | 9/1995 | Hu et al. |
| 5,455,432 A | 10/1995 | Hartsell et al. |
| 5,463,234 A | 10/1995 | Toriumi et al. |
| 5,477,169 A | 12/1995 | Shen et al. |
| 5,523,603 A | 6/1996 | Fishbein et al. |
| 5,543,652 A | 8/1996 | Ikeda et al. |
| 5,552,622 A | 9/1996 | Kimura |
| 5,606,177 A | 2/1997 | Wallace et al. |
| 5,633,178 A | 5/1997 | Kalnitsky |
| 5,689,458 A | 11/1997 | Kuriyama |
| 5,698,997 A | 12/1997 | Williamson, III et al. |
| 5,705,827 A | 1/1998 | Baba et al. |
| 5,732,014 A | 3/1998 | Forbes |
| 5,761,114 A | 6/1998 | Bertin et al. |
| 5,770,958 A | 6/1998 | Arai et al. |
| 5,773,996 A | 6/1998 | Takao |
| 5,798,965 A | 8/1998 | Jun |
| 5,804,475 A | 9/1998 | Meyer et al. |
| 5,843,812 A | 12/1998 | Hwang |
| 5,869,845 A | 2/1999 | Van der Wagt et al. |
| 5,883,549 A | 3/1999 | De Los Santos |
| 5,883,829 A | 3/1999 | Van der Wagt |
| 5,895,934 A | 4/1999 | Harvey et al. |
| 5,903,170 A | 5/1999 | Kulkarni et al. |
| 5,907,159 A | 5/1999 | Roh et al. |
| 5,936,265 A | 8/1999 | Koga |
| 5,945,706 A | 8/1999 | Jun |
| 5,953,249 A | 9/1999 | Van der Wagt |
| 5,959,328 A | 9/1999 | Krautschneider et al. |
| 5,962,864 A | 10/1999 | Leadbeater et al. |
| 6,015,739 A | 1/2000 | Gardner et al. |
| 6,015,978 A | 1/2000 | Yuki et al. |
| 6,075,265 A | 6/2000 | Goebel et al. |
| 6,077,760 A | 6/2000 | Fang et al. |
| 6,084,796 A | 7/2000 | Kozicki et al. |
| 6,091,077 A | 7/2000 | Morita et al. |
| 6,097,036 A | 8/2000 | Teshima et al. |
| 6,104,631 A | 8/2000 | El-Sharawy et al. |
| 6,128,216 A | 10/2000 | Noble, Jr. et al. |
| 6,130,559 A | 10/2000 | Balsara et al. |
| 6,150,242 A | 11/2000 | Van der Wagt et al. |
| 6,184,539 B1 | 2/2001 | Wu et al. |
| 6,205,054 B1 | 3/2001 | Inami |
| 6,222,766 B1 | 4/2001 | Sasaki et al. |
| 6,225,165 B1 | 5/2001 | Noble, Jr. et al. |
| 6,246,606 B1 | 6/2001 | Forbes et al. |
| 6,261,896 B1 | 7/2001 | Jun |
| 6,294,412 B1 | 9/2001 | Krivokapic |
| 6,301,147 B1 | 10/2001 | El-Sharawy et al. |
| 6,303,942 B1 | 10/2001 | Farmer |
| 6,310,799 B1 | 10/2001 | Duane et al. |
| 6,353,251 B1 | 3/2002 | Kimura |
| 6,396,731 B1 | 5/2002 | Chou |
| 6,404,018 B1 | 6/2002 | Wu et al. |
| 6,424,174 B1 | 7/2002 | Nowak et al. |
| 6,448,161 B1 | 9/2002 | Krivokapic |
| 6,472,263 B1 | 10/2002 | Noble |
| 6,490,193 B1 | 12/2002 | van der Wagt et al. |
| 2001/0005327 A1 | 6/2001 | Duane et al. |
| 2001/0013621 A1 | 8/2001 | Nakazato |
| 2001/0019137 A1 | 9/2001 | Koga et al. |
| 2001/0024841 A1 | 9/2001 | Noble, Jr. et al. |
| 2001/0053568 A1 | 12/2001 | Deboy et al. |
| 2002/0017681 A1 | 2/2002 | Inoue et al. |
| 2002/0048190 A1 | 4/2002 | King |
| 2002/0054502 A1 | 5/2002 | King |
| 2002/0057123 A1 | 5/2002 | King |
| 2002/0063277 A1 | 5/2002 | Ramsbey et al. |
| 2002/0066933 A1 | 6/2002 | King |
| 2002/0067651 A1 | 6/2002 | King |
| 2002/0076850 A1 | 6/2002 | Sadd et al. |
| 2002/0093030 A1 | 7/2002 | Hsu et al. |
| 2002/0096723 A1 | 7/2002 | Awaka |
| 2002/0100918 A1 | 8/2002 | Hsu et al. |
| 2002/0109150 A1 | 8/2002 | Kajiyama |

FOREIGN PATENT DOCUMENTS

| | | |
|---|---|---|
| EP | 0655788 B1 | 1/1998 |
| EP | 0747961 A2 | 11/1998 |
| EP | 1050964 A2 | 11/2000 |
| EP | 1085656 A2 | 3/2001 |
| EP | 1107317 A1 | 6/2001 |
| EP | 0526697 B1 | 11/2001 |
| EP | 1169456 A2 | 1/2002 |
| EP | 1204146 A1 | 5/2002 |
| EP | 1251502 A1 | 10/2002 |
| JP | 8016033 A2 | 1/1996 |
| JP | 2001 01015757 A2 | 1/2001 |
| WO | WO 90/03646 A1 | 4/1990 |
| WO | WO 99/63599 A1 | 4/1999 |
| WO | WO 00/41309 A1 | 7/2000 |
| WO | WO 01/65697 A1 | 9/2001 |
| WO | WO 01/66607 A2 | 9/2001 |
| WO | WO 01/66677 A2 | 11/2001 |
| WO | WO 01/99153 A2 | 12/2001 |

OTHER PUBLICATIONS

Neel, O. L, et al., "Electrical Transient Study of Negative Resistance in SOI MOS Transistors," Electronics Letters, vol. 26, No 1, pp. 73-74, Jan. 1990.

Mohan, S. et al., "Ultrafast Pipelined Adders Using Resonant Tunneling Transistors," IEE Electronics Letters, vol. 27, No. 10, May 1991, pp. 830-831.

Zhang, J.F. et al., "Electron trap generation in thermally grown SIO2 under Fowler-Nordheim stress," J. Appl. Phys. 71 (2), Jan. 15, 1992, pp. 725-734.

Zhang, J.F. et al., "A quantitative investigation of electron detrapping in SIO2 under Fowler-Nordheim stress," J. Appl. Phys. 71 (12), Jun. 15, 1992, pp. 5989-5996.

Zhang, J.F. et al., "A comparative study of the electron trapping and thermal detrapping in SIO2 prepared by plasma and thermal oxidation," J. Appl. Phys. 72 (4), Aug. 15, 1992, pp. 1429-1435.

Luryi, S. et al., "Collector-Controlled States In Charge Injection Transistors," SPIE-92 Symposium, pp. 1-12, 1992.

Luryi, S. et al., "Collector-Controlled States and the Formation of Hot Electron Domains In Real-Space Transfer Transistors," AT&T Bell Laboratories, pp. 1-7, 1992.

Luryi, S. et al., "Light-emitting Logic Devices based on Real Space Transfer In Complementary InGaAs/InAIAs Heterostructures", In "Negative Differential Resistance and Instabilities in 2D Semiconductors", ed. by N. Balkan, B. K. Ridley, and A. J. Vickers, NATO ASI Series (Physics) B 307, pp. 53-82, Plenum Press (New York 1993).

Mohan, S, et al., "Logic Design Based on Negative Differential Resistance Characteristics of Quantum Electronic Devices," IEE Proceedings-G: Electronic Devices, vol. 140, No. 6, Dec. 1993, pp. 383-391.

Mohan, S. et al., "Ultrafast Pipelined Arithmetic Using Quantum Electronic Devices," IEE Proceedings-E: Computers and Digital Techniques, vol. 141, No. 2, Mar. 1994, pp. 104-110.

Chan, E. et al., "Compact Multiple-Valued Multiplexers Using Negative Differential Resistance Devices," IEEE Journal of Solid-State Circuits, vol. 31, No. 8, Aug. 1996, pp. 1151-1156.

Chan, E. et al., "Mask Programmable Multi-Valued Logic Gate Using Resonant Tunneling Diodes," IEE Proceedings-Circuits Devices Syst., vol. 143, No. 5, Oct. 1996, pp. 289-294.

Shao, Z. et al., "Transmission Zero Engineering In Lateral Double-Barrier Resonant Tunneling Devices," Dept. Of Electrical Engineering, University of Notre Dame, pp. 1-7 (1996).

Goldhaber-Gordon, David et al., "Overview of nanoelectronic devices," Proc. IEEE, 85(4), Apr. 1997, pp. 521-540.

Koester, S. J. et al., "Negative Differential Conductance in Lateral Double-Barrier Transistors Fabricated In Strained SI Quantum Wells," Applied Physics Letters, vol. 70, No. 18, May, 1997, pp. 2422-2424.

Dozsa, L. et al., "A transient method for measuring current-voltage characteristics with negative differential resistance regions," Research Institute for Technical Physics, P. O. Box 76, H-1325 Budapest, Hungary, (Received Jul. 24, 1997; accepted Aug. 1, 1997), 2 pages.

Pacha, C. et al., "Design of Arithmetic Circuits using Resonant Tunneling Diodes and Threshold Logic," Lehstuhl Bauelements der Elektrotechnik, Universitat Dortmund, pp. 1-11, Sep. 1997.

Hansch, W. et al., "The planar-doped-barrier-FET: MOSFET overcomes conventional limitations," ESSDERC'97 27th European Solid-State Device Research Conference, Stuttgart, Sep. 22-24, 1997, 4 pages.

Wirth, G. et al., "Periodic transconductance oscillations in sub-100nm MOSFETs," ESSDERC'97 27th European Solid-State Device Research Conference, Stuttgart, Sep. 22-24, 1997, 4 pages.

Haddad, G. I. et al., "Tunneling Devices and Applications in High Functionality/Speed Digital Circuits," Solid State Electronics, vol. 41, No. 10, Oct. 1997, pp. 1515-1524.

Gardner, C. et al., "Smooth Quantum Hydrodynamic Model Simulation of the Resonant Tunneling Diode," Dept. Of Mathematics Arizona State University, pp. 1-5, (1998).

Jungel, A. et al., "Numerical Simulation of Semiconductor Devices: Energy-Transport and Quantum Hydrodynamic Modeling," Fachbereich Math., Tech. Univ. Berlin, Germany, pp. 1-9, 1998.

Nimour, S. M. A. et al., "Effect of Spatially Disordered Barriers on the Band Structure of Finita Superlattices," phys. stat. aol. (b) 1998, 209, No. 2, 311-318.

Rommel, S. L. et al., "Room Temperature Operation of Epitaxially Grown SI/SIO.5Qe0.5/SI Resonant Interband Tunneling Diodes," Applied Physics Letters, vol. 73, No. 15, pp. 2191-2193, 1998.

Van Der Wagt, J. P. A. et al., "RTD/HFET Low Standby Power SRAM Gain Cell," Source: Corporate Research Laboratories, Texas Instruments, 1998, 4 pages.

Sun, J. P. et al., "Resonant Tunneling Diodes: Models and Properties," Proceedings of the IEEE, vol. 86, No. 4, Apr. 1998, pp. 641-661.

Mazumder, P. et al., "Digital Circuit Applications of Resonant Tunneling Devices," Proceedings of the IEEE, vol. 86, No. 4, pp. 664-686, Apr., 1998.

News Release from www.surekalert.org/releases/udel-udcnfib.html, "UD Computer News: Future Looks Bright for Tunnel Diodes, Promising Faster, More Efficient Circuits," Oct. 1, 1998, 4 pages.

Seabaugh A. et al., "Resonant Tunneling Mixed Signal Circuit Technology," Solid-State Electronics 43:1355-1365, 1999.

Wirth, G. et al., "Negative Differential Resistance in Ultrashort Bulk MOSFETs," IECON'99 Conference Proceedings, vol. 1, San Jose, 1999, pp. 29-34.

Mathews, R. H. et al., "A New RTD-FET Logic Family," Proceedings of the IEEE, vol. 87, No. 4, pp. 596-605, 1999.

Van Der Wagt, J. P. A., "Tunneling-Based SRAM," Proceedings of the IEEE, vol. 87, No. 4, pp. 571-595, 1999.

Heij, C. P. et al., "Negative Differential Resistance Due to Single-Electron Switching," Applied Physics Letters, vol. 74, No. 7, Feb. 15, 1999, 5 pages.

Pacha, C. et al., "Resonant Tunneling Device Logic Circuits," Microelectronics Advanced Research Initiative (MEL-ARI,) Jul. 1998-Jul. 1999, pp. 1-22.

Hong, J.W. et al., "Local charge trapping and detection of trapped charge by scanning capacitance microscope In SIO2/Si system," Appl. Phys. Lett., 75(12), Sep. 20, 1999, pp. 1760-1762.

Haddab, Y. et al., "Quantized current jumps in silicon photoconductors at room temperature," J. Appl. Phys. 86 (7), Oct. 1, 1999, pp. 3787-3791.

Seabaugh, A., "Promise of Tunnel Diode Integrated Circuits," Tunnel Diode and CMOS/HBT Integration Workshop, Dec. 9, 1999, Naval Research Laboratory, Washington, DC., 13 Pages.

Zhang, J., "Traps: Detrapping," Wiley Encyclopedia of Electrical and Electronics Engineering Online, Article Posting Date: Dec. 27, 1999, John Wiley & Sons, Inc., 4 Pages.

Zhang, J., "Traps: Effects of Traps and Trapped Charges on Device Performance," Wiley Encyclopedia of Electrical and Electronics Engineering Online, Article Posting Date: Dec. 27, 1999, John Wiley & Sons, Inc., 2 Pages.

Zhang, J., "Traps: Measurement Techniques," Wiley Encyclopedia of Electrical and Electronics Engineering Online, Article Posting Date: Dec. 27, 1999, John Wiley & Sons, Inc., 5 Pages.

Zhang, J., "Traps," Wiley Encyclopedia of Electrical and Electronics Engineering Online, Article Posting Date: Dec. 27, 1999, John Wiley & Sons, Inc., 2 Pages.

Zhang, J., "Traps: Trapping Kinetics," Wiley Encyclopedia of Electrical and Electronics Engineering Online, Article Posting Date: Dec. 27, 1999, John Wiley & Sons, Inc., 2 Pages.

Zhang, J., "Traps: Origin of Traps," Wiley Encyclopedia of Electrical and Electronics Engineering Online, Article Posting Date: Dec. 27, 1999, John Wiley & Sons, Inc., 4 pages.

Gonzalez, A. et al., "Standard CMOS Implementation of a Multiple-Valued Logic Signed-Digit Adder Based on Negative Differential-Resistance Devices," Proceedings of the 30th IEEE International Symposium on Multiple-Valued Logic (ISMVL 2000), 6 pages.

Karna, Shashi P. et al., "Point defects in SI-SIO2 systems: current understanding," Published In G. Pacchloni et al. (eds.), "Defects In SIO2 and related dielectrics: science and technology," Kiuwer Academic Publishers, (2000), 19 pages.

King, Tsu-Jae et al., U.S. Appl. No. 09/602,658, entitled "CMOS Compatible Process for Making a Tunable Negative Differential Resistance (NDR) Device," filed Jun. 22, 2000, 33 pages.

King, Tsu-Jae et al., U.S. Appl. No. 09/603,101, entitled "CMOS-Process Compatible, Tunable NDR (Negative Differential Resistance) Device and Method of Operating Same," filed Jun. 22, 2000, 34 pages.

King, Tsu-Jae et al., U.S. Appl. No. 09/603,102, entitled "Charge Trapping Device and Method for Implementing a Transistor having a Negative Differential Resistance Mode," filed Jun. 22, 2000, 39 pages.

Geppert, Linda, "Quantum transistors: toward nanoelectronics," IEEE Spectrum, Sep. 2000, pp. 46-51.

Seabaugh, A. et al., "Tunnel-Diode IC," Minneapolis, Oct. 2, 2001, 23 pages.

Believed to be published in: Deen, Jamal (editor) et al., excerpt from "CMOS RF modeling, characterization and applications," World Scientific, Apr. 2002, 34 pages.

Scoffield, John H. et al., "Reconciliation of different gate-voltage dependencies of 1/f noise in n-MOS and p-MOS transistors," IEEE Trans. Electron. Dev. 41 (11), 11 pages.

Final Report: SMILE MEL-ARI Project n°28741—Chapter V, pp. 184-194.

Villa, S. et al. "Application of 1-f noise measurements to the characterization of near-interface oxide states in ULSI n-MOSFET's," Dipartlmento di Elettronica e Informazione, Politecnico di Milano (Italy), 7 pages.

Nemati, F. et al., "A Novel High Density, Low Voltage SRAM Cell With a Vertical NDR Device," Center for Integrated Systems, Stanford University, CA, (2 pages).

Nemati, F. et al., "A Novel Thyristor-based SRAM Cell (T-RAM) for High-Speed, Low-Voltage, Giga-scale Memories," Center for Integrated Systems, Stanford University, CA, (4 pages).

Shoucair F. et al., "Analysis and Simulation of Simple Transistor Structures Exhibiting Negative Differential Resistance," EECS Department, UC Berkeley, Berkeley CA, (4 pages).

Oberhuber, R. et al., "Tunnel-Devices with Negative Differential Resistivity Based on Silicon?," Source: Deutsche Forschungsgemeinschaft and Siemens AG, date unknown, 2 pages.

ENHANCED READ AND WRITE METHODS FOR NEGATIVE DIFFERENTIAL RESISTANCE (NDR) BASED MEMORY DEVICE

RELATED APPLICATION

The present application is a continuation of U.S. patent application Ser. No. 10/185,247 filed by Tsu-Jae King on Jun. 28, 2002, now U.S. Pat. No. 6,847,562.

FIELD OF THE INVENTION

This invention generally relates to methods of operating semiconductor memory devices and technology, and in particular to read/write operations for static random access memory (SRAM) devices that utilize negative differential resistance (NDR) elements.

BACKGROUND OF THE INVENTION

A new type of SRAM device using Negative Differential Resistance Field Effect Transistors (NDR FETs) is described in detail in a patent application Ser. No. 10/029,077 filed Dec. 21, 2001 by T J King and assigned to the present assignee, and published on May 9, 2002 as Publication No. 2002/0054502. The NDR FET structure, operation and method of making the same are discussed in detail in patent application Ser. No. 09/603,101 filed Jun. 22, 2000 by King et al., which is also assigned to the present assignee. Such details are also disclosed in a corresponding PCT application PCT/US01/19825 which was published as publication no. WO01/99153 on Dec. 27, 2001. The above materials are hereby incorporated by reference.

As is well-known in the art, some of the important benchmarks for memory devices that determine the suitability for a particular application include the quiescent power rating, read speed and write speed. Furthermore, the peak-to-valley ratio (PVR) of the operating and quiescent current for a cell is also a significant factor that limits the feasibility of certain embodiments. For many applications it is believed that a PVR must exceed 10,000 to be practical at commercially desirable densities (i.e., in the MB range and above). Thus, it is apparent that the aforementioned NDR based SRAMs (and other NDR based memories) would also benefit from an increase in operating performance of the NDR elements to meet the aforementioned benchmarks.

SUMMARY OF THE INVENTION

An object of the present invention is to provide operating methods that improve characteristics of a memory device, including particularly those that incorporate static random access memory (SRAM) cells which utilize NDR FET elements.

A first aspect of the invention therefore concerns a method of operating a memory cell that includes a negative differential resistance (NDR) capable element. This generally includes the following steps: applying a bias signal to the NDR-capable element, during a first operation period in which the memory cell is storing a data value, to enable the NDR-capable element to operate with an NDR characteristic. This NDR characteristic is adjusted to facilitate storing of the data value in the memory cell during a first storage operation. During a second operation (i.e., such as a write operation) the bias signal is adjusted so as to lower the peak current (and thus also disable the NDR characteristic) immediately prior to and/or during the second operation.

In a preferred approach, the NDR-capable element is an NDR field effect transistor (FET) and the NDR characteristic is exhibited in a channel region of the NDR FET. In this manner, the bias signal is applied to a gate of the NDR FET and is adjusted so that the peak current is substantially lowered. Further in a preferred approach, the bias signal is adjusted immediately during the second operation period to re-enable the NDR characteristic and facilitate storing of a new data value written to the memory cell.

Another aspect of the invention concerns a method of operating a memory cell that exhibits variable NDR behavior during a write operation. This is achieved by applying a bias signal to the NDR element during a first period in which the memory cell is storing a data value. In this operational state, the bias signal has a first signal characteristic during the first period (for example, a high voltage level) so as to control the NDR element to have a first operating characteristic (for example, to enable an NDR behavior). During a second period, the bias signal is adjusted to have a second signal characteristic so as to control the NDR element to have a second operating characteristic (for example, to lower the peak current and disable the NDR behavior) immediately prior to and/or during a write operation associated with the memory cell.

Accordingly, in a preferred approach, the first signal characteristic is a first signal voltage amplitude level associated with the bias signal, and the second signal characteristic is a second signal voltage amplitude level associated with the bias signal. The first signal voltage amplitude level is greater than the second signal voltage amplitude level so that the first operating characteristic includes an NDR operating region and the second NDR characteristic exhibits lower peak current and may or may not include an NDR operating region.

Further in a preferred embodiment, the data value is erased before the write operation effectuates writing of a subsequent data value to the memory cell.

Finally, a preferred memory cell of this invention uses both a first NDR element (as a pull-up element) and a second NDR element (a pull-down element) connected in series to a storage node and the first NDR element. In such instances, the bias signal is applied to the second NDR element as well as the first NDR element at substantially the same time during the first period and the second period.

Yet another aspect of the invention pertains to operating a memory cell (including NDR variations) to use an indeterminate state during a write operation. This is accomplished by applying a bias signal to an NDR FET (in the memory cell) to cause it to operate with an NDR characteristic while the cell is storing a particular first data value. Later, and immediately preceding a write operation, the first data value stored in the memory cell is effectively "erased" by adjusting the bias signal to disable the NDR characteristic. In other words, the first data value is preferably represented by a first voltage potential or a second voltage potential present in a storage node of the memory cell, and during the erasing step the storage node is set to a third voltage potential. Notably, this third voltage potential is set without regard to a voltage potential associated with a second data value to be written to the memory cell, and is caused by disabling the NDR characteristic of the FET. This then results in an indeterminate state for the storage node that lies somewhere between the first voltage potential and the second potential. The final value is not critical to this aspect of the invention. During the actual write operation, the second data value is written to the memory cell so that the storage node is adjusted from the third voltage potential (either up or down) to one of at least the first voltage potential or the second voltage potential.

In a preferred embodiment, the cell is designed and operated so that the third voltage potential corresponds to a voltage potential that is approximately half-way between the first voltage potential and the second voltage potential. This ensures that (for random data at least), the overall current consumed is reduced.

Further in a preferred approach for this aspect of the invention, the NDR FET is a pull-up element in the memory cell, and the bias signal is also applied to a second NDR FET acting as a pull-down element of the memory cell.

In yet another aspect of the invention, an "erase before write" operation is performed for a memory cell, including an SRAM, by adjusting a bias signal to the pull-down and pull-up elements. This then effectively erases the cell by placing the storage node in an indeterminate state. To do this, the bias signal is set to a first amplitude, and then to a second amplitude that is less than the first amplitude during the erase step. After the new data is written to the cell the bias signal is restored from the second amplitude back to the first amplitude. To control the cell in this fashion a bias control signal is generated, in response to initiation of a write operation, to control signal characteristics of the bias signal, including an amplitude of such signal.

Other aspects of the invention concern operations which enhance characteristics of active elements for a memory cell, including characteristics of read operations performed for an NDR based memory cell.

In a first aspect, an NDR based memory cell operates by applying a bias signal to the NDR-capable element, during a first operation period in which the memory cell is storing a data value, to enable the NDR-capable element to operate with an NDR characteristic. The NDR characteristic is adjusted to facilitate storing of the data value in the memory cell during a first storage operation. During a second operation period the bias signal is adjusted so as to enhance the NDR characteristic and a current drive characteristic of the NDR-capable element immediately prior to and/or during a second operation associated with the memory cell.

In this fashion, additional current can be provided to improve a read speed for the memory cell. In a preferred approach, the NDR-capable element includes an NDR field effect transistor (NDR FET). During the read operation, the bias signal is adjusted to have an amplitude that is larger than that used during quiescent storage mode. This allows an NDR memory cell to be viable in a multi-megabit memory array, since a ratio of a quiescent current produced by the memory cell to a read operation current (PVR) produced by the memory cell can exceed 10,000. Other techniques for accelerating a read speed, such as precharging a BIT line coupled to the memory cell, can also be employed.

Another aspect of the invention concerns adjusting the NDR behavior of a memory cell during a read operation, analogous to that explained above for a write operation—except that for a read operation the NDR behavior is enhanced rather than impaired.

These and other aspects of the invention are now described in detail with reference to the figures provided herein.

DETAILED DESCRIPTION OF THE INVENTION

Various embodiments of the invention are now described.

Figure 1:
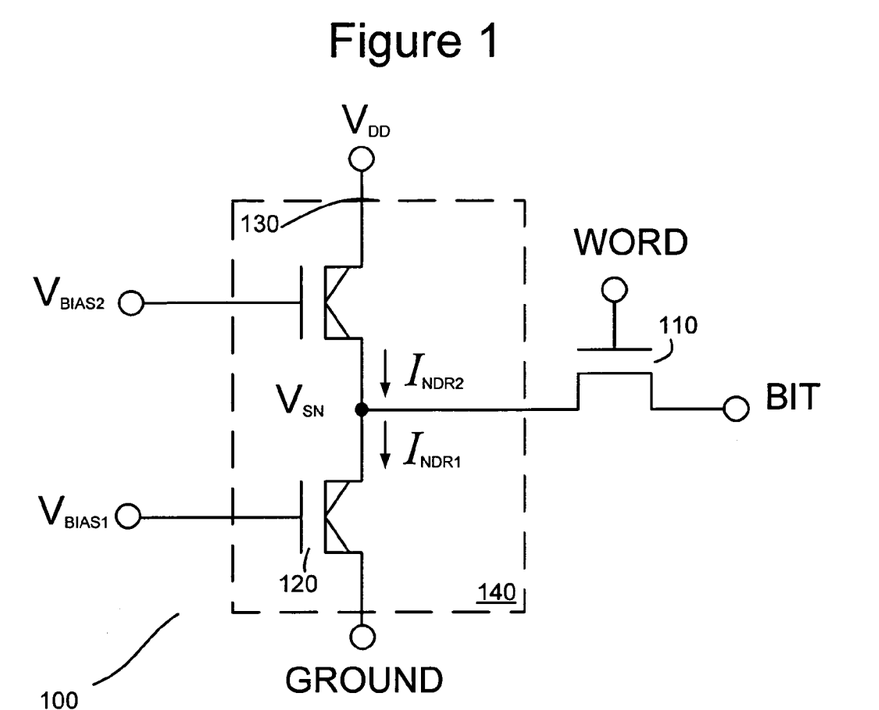
FIG. 1 is a circuit diagram of a static random access memory (SRAM) cell consisting of the combination of two NDR-FET elements which form a bistable latch and one n-channel enhancement-mode IGFET access element.

As noted earlier, FIG. 1 is a circuit diagram of a preferred embodiment of a static memory (SRAM) cell 100 consisting of two NDR elements 120, 130 that form a bistable latch 140 and one enhancement-mode IGFET access element 110. While a three (3) element implementation is shown in FIG. 1, the invention is by no means limited to such embodiments, as other designs employing NDR elements can also benefit from the present teachings. Within cell 100 NDR element 120 can be considered a pull-down element, or a driver element, while NDR element 130 is considered as a pull-up element, or a load element as those terms are understood in this field of art.

Figure 2:
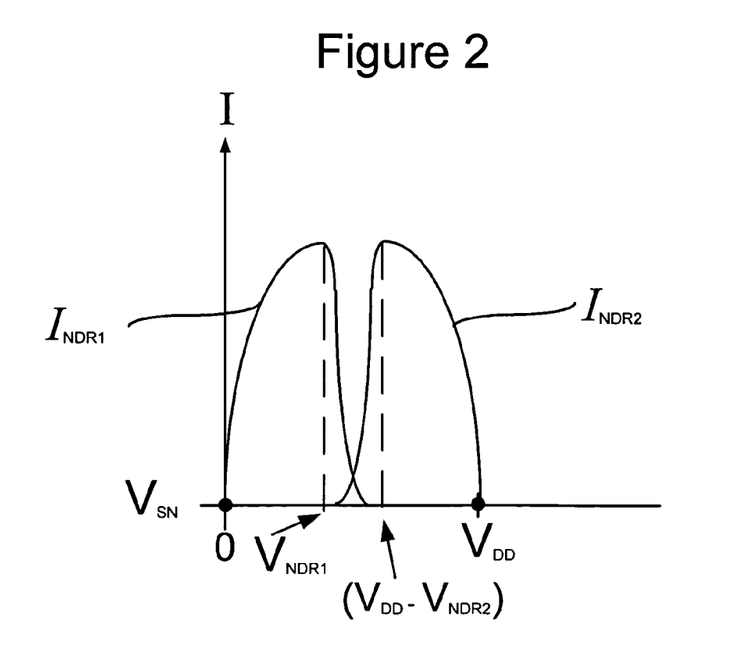
FIG. 2 is a plot of the current-vs.-voltage characteristic of the bistable latch formed by the combination of two NDR-FETs as shown in FIG. 1.

FIG. 2 is a current-vs.-voltage plot illustrating the general operational characteristics of the static memory cell 100 of FIG. 1, including in a storage mode of operation. Again, it will be understood by those skilled in the art that this Figure is merely intended to give an overall understanding of the general I–V characteristics of an NDR element, and that the performance of any particular implementation of the invention may vary from that shown in FIG. 2 without straying from the scope of the present invention.

NDR elements 120, 130 of the present invention are preferably an NDR FET of the type referred to above in the aforementioned King et al. applications. The details of the same are provided for example in the aforementioned applications, and such documents are incorporated by reference herein primarily for the purpose of providing non-essential background information on representative types of environments in which the present inventions can be practiced. Other types of silicon based NDR FETs are clearly suitable and encompassed within the present teachings, particularly to the extent their PVR performance can be enhanced through intelligent biasing as noted below.

Enhanced Write Operation

A preferred method for writing to an NDR based SRAM cell is now described. It will be understood by those skilled in the art that the present invention could be used with other memory devices (aside from SRAMs of the type shown in the aforementioned Ser. No. 10/029,077), including for example those that utilize active elements having NDR characteristics.

In brief, to improve write access time, the NDR element (a metal oxide semiconductor transistor—referred to as MOST herein, which is a type of field effect transistor (FET)) gate bias voltage(s) are pulsed low to lower the peak current of both NDR MOST transistors just prior to programming (word line pulsed high). The gate bias voltage(s)

would return to the "normal" high-voltage state just after the word line voltage reaches the high voltage state.

Viewed from an operational perspective, memory device 100 may be effectively considered erased and set to a third logical state that is intermediate or between two extreme possible states (i.e., a high voltage potential or a low voltage potential present on the storage node). This state can also be characterized as indeterminate (in the sense that the ultimate ending state is uncertain or unpredictable depending on the amount of time reserved for such operation), but which is nonetheless "easier" (and faster) to write to, instead of having it start off as a logical 0 state or logical 1 state. In a preferred approach, storage node VSN is set to a voltage potential that is about half-way between VDD and Ground (or $V_{SS}$) as seen in FIG. 1. This again, can be thought of as a form of directly pre-charging the storage node or the memory cell in anticipation of the data value to be written. This procedure, therefore, may have advantages in other SRAM memory environments aside from NDR based cells, as a type of erase before (or as part of) a write operation.

This operation is described in detail with reference to FIG. 3A. Prior to time $t_0$ the memory cell is in a quiescent mode of operation, in which it is operating to store a particular data value. At this time a write bias disable/control signal is generated, causing both Vbias1 and Vbias2 inputs to go from a normal NDR-capable voltage state to a lower voltage state beginning at time $t_1$ and reaching a final low state at time $t_2$. At this point and in this form, the bias signals are adjusted to enhance a write operation for the cell, and can be considered as write-enhancement signals. Because NDR FETS 120 and 130 (FIG. 1) use a somewhat higher bias signal, it is possible to reduce Vbias1 and Vbias2 only by an amount needed (i.e, only partway to Vss) to lower the peak current of the NDR FETs (and thus disable the NDR behavior of such FETs as well). Accordingly, this operation can be accomplished in a very short period of time. In a preferred embodiment NDR FETs 120 and 130 are connected to a common bias signal (i.e., Vbias1 and Vbias2 are the same).

At time $t_3$, a write signal is applied to transfer FET 110, and a new data value is written (programmed) into memory cell 100 through the BIT line in any conventional fashion during a write mode or write operation for the cell. Since both NDR FETs are essentially disabled, they do not materially affect the write speed of a particular data value (0 or 1) into node $V_{SN}$ during a write time $t_w$ (which lasts until $t_7$). At time $t_4$, the write bias control signal goes low, and thus at time $t_5$ the respective bias signals to the two NDR FETs begin to be restored to their original state, so that at time $t_6$ the two NDR FETs again contribute to the maintenance (latching) of the data value as written into the memory device (i.e., during a later storage mode) through their respective NDR characteristics.

Figure 3A:
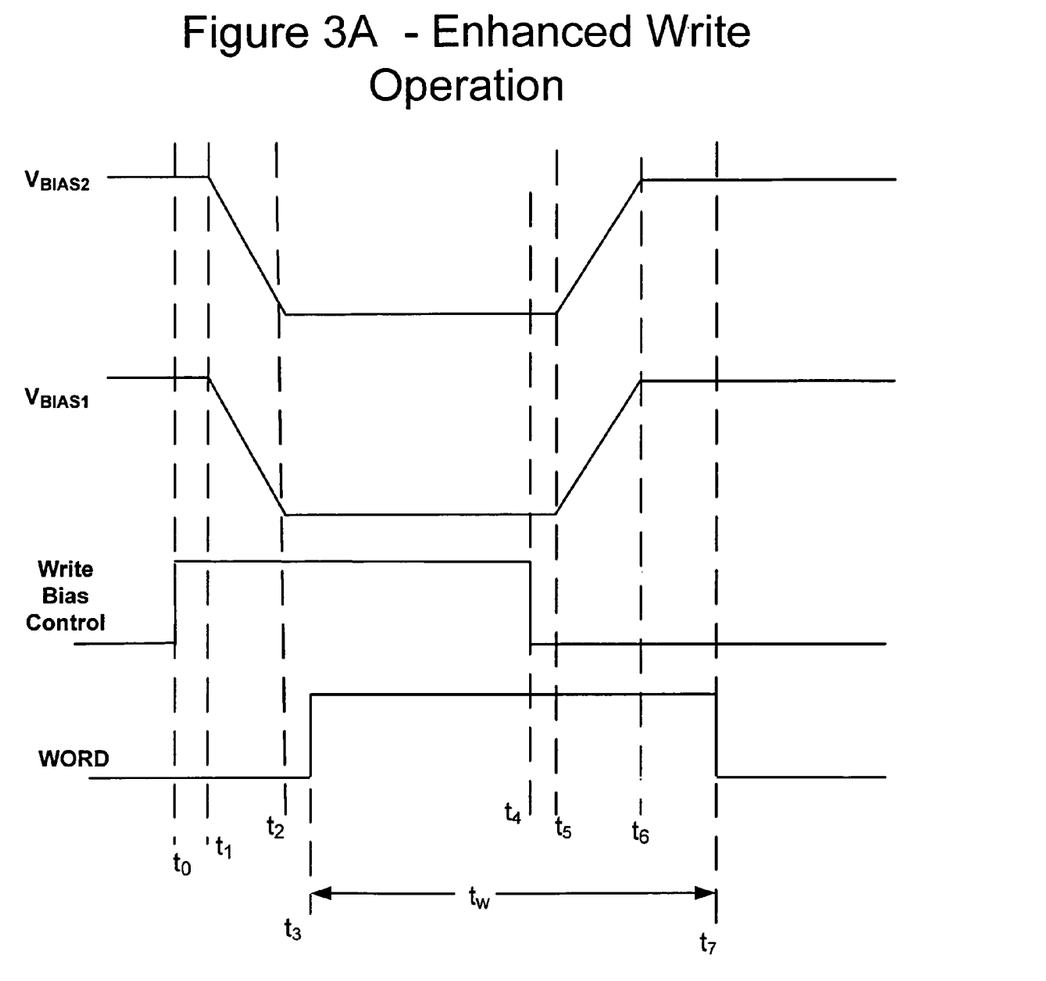
FIG. 3A is a timing diagram illustrating the general sequence and relationship of signals used in memory embodiments that incorporate a preferred writing method of the present invention.

It will be understood by those skilled in the art that the timing as shown in FIG. 3A is merely exemplary, and that other variations could be beneficially employed and still be encompassed by the present invention. For example, when two input bias signals are used, they might be separately disabled at different times; similarly, they may be re-enabled at different times. Furthermore, there may be some overlap permitted in some cases between when the write signal is activated ($t_3$) and the period in which the NDR bias signals are reaching their lower voltage state (from $t_1$ to $t_2$). While the write Bias control is shown as a single signal, it will be understood that in fact its function can be achieved by several independent signals in accordance with standard design techniques.

Moreover, the diagram is not intended to be to scale, so the initiation, slew rate, amplitude and duration of the signals shown can be varied without departing from the spirit of the present invention. The various circuits required to implement the timing of FIG. 3A, including the generation of the write bias control (disable) signal based on initiation of a write operation, and the adjustment of Vbias1 and Vbias2 during a write operation or write mode, can be constructed by a variety of means through ordinary design skill. The particulars of such circuit are not material to the present teachings, so the invention is by no means limited to any particular implementation of the same. In addition to controlling the signal amplitude level, other methods for controlling the respective bias signals to the NDR FETs will be apparent to skilled artisans to achieve substantially the same result.

Thus, from this description it can be seen that both NDR FETs originally in a storage operating mode are essentially weakened (or completely disabled) just prior to the programming operation (or write mode) to reduce/eliminate any contribution to the write operation. The NDR FETs are turned on again before the write operation is finished so that they then "latch" the stored data at node SN by their NDR behavior as noted in the aforementioned application Ser. No. 10/029,077. This process has the additional benefit that overall power consumption is also reduced for write operations as compared to prior techniques.

Looked at from another perspective, the present invention can be thought of as temporarily disabling an otherwise advantageous NDR behavior during certain operational time periods for a memory cell, such as during selected portions of a write process. It is conceivable that it may be also desirable to disable such NDR behavior during other times (power up, reset, test) for the memory cell, or in other circuits during their normal operations; such are clearly contemplated by the present teachings. Finally, other general memory cells/devices (not including NDR elements) may benefit from selective enabling/disabling of pull-up and pull-down elements contained therein to enhance a write operation.

It will be understood, of course, that, at least for a write process, it may not be necessary to completely disable such devices prior to such operation, and the overall write process may be improved significantly even by biasing techniques that merely impair or reduce the participation of the NDR FETs during selected portions (or all) of a write operation.

This write enhancement of the present invention is extremely useful because typically with reference to FIG. 1, if storage node VSN is at a low value, and a write operation is to be performed for a high value, then cell 100 does not get set to a stable operating point until an NDR behavior of NDR element 120 shuts it off. At such time, node VSN is thus completely controlled by pull-up element 130 which sets it to a high potential (i.e., VDD or thereabouts). A similar situation arises for the opposite case where a write operation is to be performed for a low value when the storage node VSN is at a high value. Accordingly, a write-speed for a typical NDR SRAM cell 100 is controlled by NDR switching characteristics of NDR FETs 120 and 130. By disabling an NDR characteristic of the NDR FETs in advance of a write operation, the switching time to stabilize a new value written to cell 100 is reduced because the NDR elements are at least partly shut off while the data is being written.

It should be noted that in some instances this type of write "enhancement" will not be necessary or desirable. For example, in cases where the overall write time (as shown in FIG. 3A) exceeds a period required for a conventional write operation, it is preferable not to use the aforementioned technique. This may be possible when the operating characteristics of the NDR elements (their settling times) are sufficiently fast to pull the storage node up or down in a time quicker than that possible using the enhanced technique noted above. This limiting factor, in turn will determine the extent to which the NDR FET element bias voltages needs to be attenuated for any particular application.

Read Operation Enhancement

In a similar fashion, a further related aspect of the invention pertains to a preferred method for reading an NDR based SRAM cell, such as the type discussed above. Again, it will be understood by those skilled in the art that the present invention could be used with other memory devices (aside from SRAM), including those that utilize active elements having NDR characteristics.

In summary, to improve read access time during a read mode, the NDR FET gate bias voltage(s) are pulsed to a higher-than-"normal", voltage just before the word line is pulsed high. The resulting higher peak current charges the bit line faster, for faster read access time. After the read operation is completed, the gate bias voltages are then returned to the "normal" high-voltage state just after the word line returns to the low-voltage state to ensure proper maintenance of the data value during a subsequent storage mode.

Viewed from another perspective, it can be seen that in contrast to the write enhancement operation described earlier, the NDR FETs in the read enhancement method of the present invention have their peak current (and to some extent their NDR behavior) effectively "enhanced" rather then reduced (or disabled) during a read mode. In this manner, the overall peak-to-valley ratio (PVR) of a memory cell using NDR devices can be enhanced by such technique. In other words, the peak current of the memory cell is increased without a corresponding increase in the valley current, because the "boost" to the current is performed only during portions (or all of) a read operation. Furthermore, the NDR FETs of the present invention are characterized by the fact that a peak current increases with increasing applied gate voltage (i.e., in a non-NDR operating region) but the valley current does not increase as quickly with increasing applied gate voltage. Thus, the PVR improves generally as a function of a gate drive applied to NDR FETs 120 and 130, and this aspect can be exploited in SRAM embodiments through dynamically varying the gate bias signals as explained herein. By this same principle, therefore, the PVR for any particular embodiment, such as for a low power embodiment, can also be improved by reducing gate bias signals to NDR FETs 120, 130 to reduce a valley current, just as they were raised during a sense or read mode to increase a peak current. Furthermore, unlike many other prior art devices, by using NDR FETs in an SRAM cell, the PVR is substantially more constant over temperature, and this is yet another benefit of using such technology.

The preferred reading method is described in detail with reference to FIG. 3B. Prior to a read mode, the memory cell is in a quiescent storage mode as noted earlier. Just before a read operation commences, namely, at time $t_0$, a read bias control (in this case, a read enhancement) signal is generated, causing both Vbias1 and Vbias2 inputs to go from a normal NDR-capable voltage state to a higher voltage state starting at time $t_1$ and reaching a final high state at time $t_2$. At this point and in this form, the bias signals are adjusted to be enhance a read operation for the cell, and can be considered as read-enhancement signals. Again, in a preferred embodiment, as noted earlier, both NDR FETs are connected to a common bias line and bias signal.

Because NDR FETS provide a drive current proportional to their gate voltage, it is possible to boost Vbias1 and Vbias2 by a controlled amount which also increases the NDR behavior of such FETs. Accordingly, this read operation can be accomplished in a very short period of time. At time $t_3$, a read signal is applied to transfer FET 140, and a data value stored in memory cell 100 is read through the bit line.

Note that to improve operational speed for higher speed applications, the bit line can be precharged to a value midway a logical 0 and logical 1 state (typically, Vdd/2) so that it is either pulled high or low more quickly than if it were starting from a fixed potential that is high or low. In addition, a reference cell (not shown) can be used to allow differential sensing against a sensed cell in a manner akin to that of conventional memory cells and differential sense amplifiers. Other techniques for increasing read time performance will be apparent to those skilled in the art.

Since both NDR FETs are essentially enhanced during parts or all of a read mode or read operation, they help to provide an additional drive current during the reading of a particular data value (0 or 1) in node $V_{SN}$ during a read time $t_R$ (which lasts until $t_4$). At time $t_5$, the read bias control (NDR enhancement) signal goes low again, so that the two NDR FET bias signals are returned to their normal operating value beginning at time $t_6$ and finishing at time $t_7$. Thereafter they again contribute to the maintenance (latching) of the data value as stored into the memory device through their NDR characteristics.

Because there is no adverse effect from enhancing the NDR behavior during the read process, it is not necessary to return the NDR FETs to their normal operating bias prior to completion of the read operation. Nonetheless, this could be done if desired by appropriate adjustment of the bias control signal.

One consequence of using two NDR FETs is that the overall read (or sensing) speed of cell 100 is not limited or tied to an NDR switching speed of an NDR element (i.e., between an NDR region and a non-NDR region). This is advantageous for scaling purposes as well.

Figure 3B:
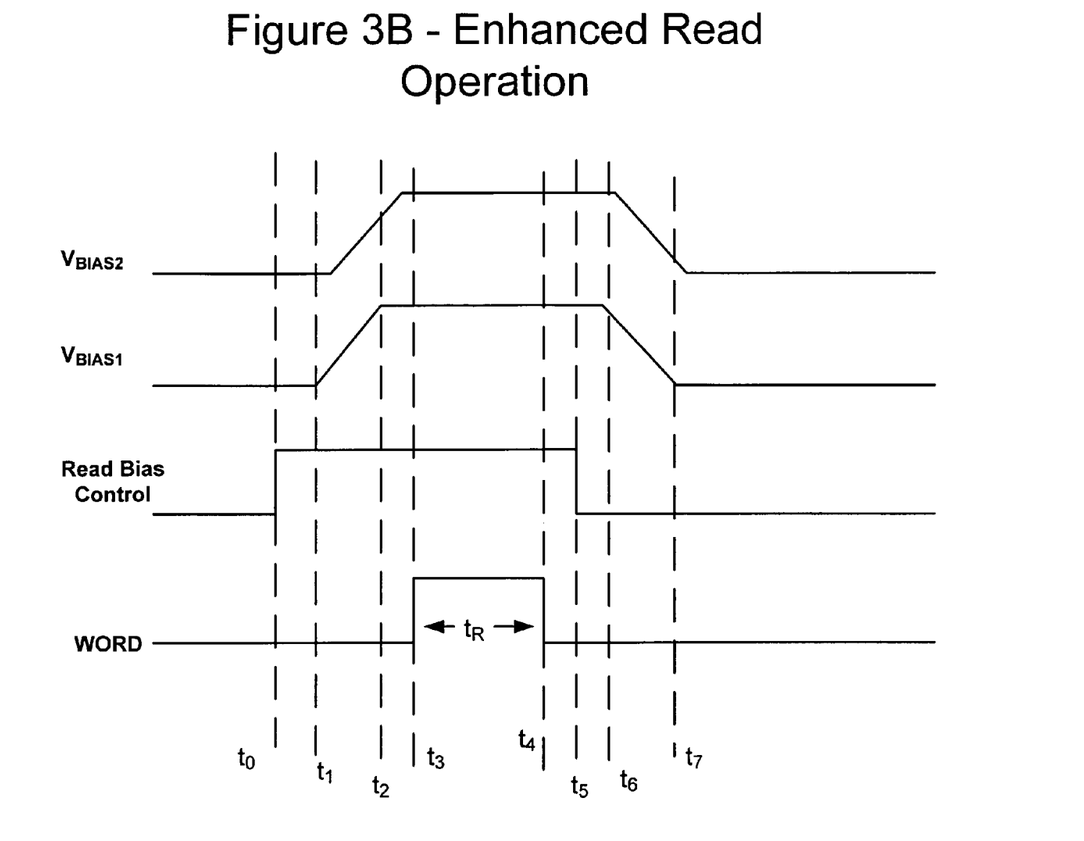
FIG. 3B is a timing diagram illustrating the general sequence and relationship of signals used in memory embodiments that incorporate a preferred reading method of the present invention.

As with FIG. 3A, it will be understood by those skilled in the art that the timing as shown in FIG. 3B is merely exemplary, and that other variations could be beneficially employed with the present invention. For example, the two input bias signals Vbias1 and Vbias2 might be separately enhanced at different times; similarly, they may be returned to normal values at different times, and even, as alluded to before, during the time the read signal is still high. Furthermore, there may be some overlap permitted in some cases between when the read signal is activated ($t_3$) and the period in which the NDR bias signals are reaching their higher voltage state (from $t_1$ to $t_2$), or conversely when the read signal is deactivated ($t_4$) and the period in which the NDR bias signals are returning to their normal voltage state (from $t_6$ to $t_7$). Finally, as noted earlier, while the read Bias control signal is shown as a single signal, it will be understood that in fact its function can be achieved by several independent signals in accordance with standard design techniques.

Moreover, the diagram of FIG. 3B is not intended to be to scale, so the initiation, slew rate, amplitude and duration of the signals shown can be varied without departing from the spirit of the present invention. The various circuits required to implement the timing of FIG. 3B, including the generation of the bias enhancement signal in response to an initiation of a read operation, and the boosting of Vbias1 and Vbias2 can be constructed by a variety of means through ordinary design skill. The particulars of such circuit are not material to the present teachings, so the invention is by no means limited to any particular implementation of the same.

Looked at from another perspective, this facet of the present invention can be thought of as temporarily enhancing an NDR behavior during certain operational time periods for a memory cell, such as during a read process. It is conceivable that it may be also desirable to boost such NDR behavior during other times (power up, reset, test) for the memory cell, or in other circuits during their normal operations; such are clearly contemplated by the present teachings. Finally, as noted earlier for the write enhancement method of the present invention, other general memory cells/devices (not including NDR elements) may benefit from selective enabling/disabling of pull-up and pull-down elements contained therein during read operations.

Thus, both a write operation and a read operation can be controlled and enhanced by suitable scaling/adjustment of the bias signals provided to the NDR FETs of an NDR SRAM cells. The bias signals thus operated effectuate a type of a read control signal and write control signal for such types of memory devices.

Finally it is apparent, of course, that memory devices operating in accordance herein may utilize one or both of the read/write enhancements disclosed depending on the intended application, manufacturing limitations and required performance characteristics.

While the invention has been described with reference to illustrative embodiments, this description is not intended to be construed in a limiting sense. It will be clearly understood by those skilled in the art that foregoing description is merely by way of example and is not a limitation on the scope of the invention, which may be utilized in many types of integrated circuits made with conventional processing technologies. Various modifications and combinations of the illustrative embodiments, as well as other embodiments of the invention, will be apparent to persons skilled in the art upon reference to the description. Such modifications and combinations, of course, may use other features that are already known in lieu of or in addition to what is disclosed herein. It is therefore intended that the appended claims encompass any such modifications or embodiments. While such claims have been formulated based on the particular embodiments described herein, it should be apparent the scope of the disclosure herein also applies to any novel and non-obvious feature (or combination thereof) disclosed explicitly or implicitly to one of skill in the art, regardless of whether such relates to the claims as provided below, and whether or not it solves and/or mitigates all of the same technical problems described above. Finally, the applicant further reserves the right to pursue new and/or additional claims directed to any such novel and non-obvious features during the prosecution of the present application (and/or any related applications).

I claim:

1. A method of operating a memory cell comprising a storage node coupled between a pull-up element and a pull-down element, the method comprising:
   applying a first bias signal to at least one of the pull-up element and the pull-down element to attenuate an NDR operational characteristic of the at least one of the pull-up element and the pull-down element and set the storage node to an intermediate voltage;
   writing a data value to the memory cell by adjusting the storage node from the intermediate voltage to one of an upper voltage and a lower voltage; and
   applying a second bias signal to the at least one of the pull-up element and the pull-down element to enable the NDR operational characteristic of the at least one of the pull-up element and the pull-down element to latch the data value into the memory cell.

2. The method of claim 1, wherein the intermediate voltage is approximately halfway between the upper voltage and the lower voltage.

3. The method of claim 1, wherein applying the first bias voltage signal to the at least one of the pull-up element and the pull-down element comprises applying the first bias voltage signal to the pull-up element and the pull-down element.

4. The method of claim 3, wherein applying the second bias voltage to the at least one of the pull-up element and the pull-down element comprises applying the second bias voltage signal to the pull-up element and the pull-down element.

5. The method of claim 1, wherein the at least one of the pull-up element and the pull-down element comprises a first NDR FET.

6. The method of claim 1, wherein the pull-up element comprises a first NDR FET and the pull-down element comprises a second NDR FET.

7. The method of claim 6, wherein the first NDR FET and the second NDR FET are silicon-based NDR FET of the same type.

8. The method of claim 6, wherein the first NDR FET and the second NDR FET are different types of silicon-based NDR FETs.

* * * * *